(12) United States Patent
Lee et al.

(10) Patent No.: US 11,411,122 B2
(45) Date of Patent: Aug. 9, 2022

(54) DISPLAY DEVICE

(71) Applicant: SAMSUNG DISPLAY CO., LTD., Yongin-si (KR)

(72) Inventors: Jaeseob Lee, Yongin-si (KR); Meejae Kang, Yongin-si (KR); Yoonho Khang, Yongin-si (KR); Keunwoo Kim, Yongin-si (KR); Hanbit Kim, Yongin-si (KR); Thanhtien Nguyen, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/086,545

(22) Filed: Nov. 2, 2020

(65) Prior Publication Data
US 2021/0249542 A1 Aug. 12, 2021

(30) Foreign Application Priority Data
Feb. 11, 2020 (KR) .......................... 10-2020-0016630

(51) Int. Cl.
*H01L 29/786* (2006.01)
*H01L 27/32* (2006.01)

(52) U.S. Cl.
CPC .... *H01L 29/78696* (2013.01); *H01L 27/3244* (2013.01); *H01L 29/78618* (2013.01)

(58) Field of Classification Search
CPC ........... H01L 27/3244; H01L 29/78618; H01L 29/78696
USPC .......................................................... 257/40
See application file for complete search history.

(56) References Cited

U.S. PATENT DOCUMENTS

| | | | |
|---|---|---|---|
| 5,753,543 A | * | 5/1998 | Sandhu ............. H01L 29/66765 257/E21.414 |
| 6,365,935 B1 | | 4/2002 | Zhang et al. |
| 6,984,552 B2 | | 1/2006 | Machida et al. |
| 8,796,122 B2 | | 8/2014 | Hwang et al. |
| 9,899,233 B2 | | 2/2018 | Ren |

(Continued)

FOREIGN PATENT DOCUMENTS

| KR | 10-0623691 | 9/2006 |
|---|---|---|
| KR | 10-2019-0047156 | 5/2019 |

(Continued)

OTHER PUBLICATIONS

Kim et al., "Temperature dependent leakage currents in polycrystalline silicon thin film transistors", Journal of Applied Physics 81, 1997, pp. 8084-8090.

*Primary Examiner* — Tong-Ho Kim
(74) *Attorney, Agent, or Firm* — F. Chau & Associates, LLC

(57) ABSTRACT

A display device including: a first thin film transistor (TFT) including a first semiconductor layer and a first gate electrode, the first semiconductor layer including a first channel region, a first source region, and a first drain region; a third TFT including a third semiconductor layer and a third gate electrode, the third semiconductor layer including a third channel region, a third source region, and a third drain region, wherein a leakage current of the third TFT in an off-state is less than a leakage current of the first TFT in an off-state; and a pixel electrode connected to one of the first source region and the first drain region, wherein the one of the first source region and the first drain region is connected to the third TFT.

25 Claims, 10 Drawing Sheets

(56) References Cited

U.S. PATENT DOCUMENTS

| | | | |
|---|---|---|---|
| 10,446,638 B2 | 10/2019 | Seo et al. | |
| 2004/0211961 A1* | 10/2004 | Koo | H01L 27/1285 257/59 |
| 2016/0307979 A1* | 10/2016 | Lee | H01L 27/1222 |
| 2017/0033171 A1* | 2/2017 | Kim | H01L 27/3272 |
| 2018/0158406 A1 | 6/2018 | Kim et al. | |
| 2019/0206966 A1 | 7/2019 | Kim et al. | |
| 2019/0252479 A1* | 8/2019 | Kang | H01L 27/3262 |

FOREIGN PATENT DOCUMENTS

| | | |
|---|---|---|
| KR | 10-2019-0083025 | 7/2019 |
| KR | 10-2019-0098315 | 8/2019 |

* cited by examiner

DISPLAY DEVICE

CROSS-REFERENCE TO RELATED APPLICATION

This application claims priority under 35 U.S.C. § 119 to Korean Patent Application No. 10-2020-0016630, filed on Feb. 11, 2020, in the Korean Intellectual Property Office, the disclosure of which is incorporated by reference herein in its entirety.

TECHNICAL FIELD

Exemplary embodiments of the inventive concept relate to a display device, and more particularly, to a display device that prevents or minimizes flickering while displaying an image at a low frequency.

DESCRIPTION OF RELATED ART

Generally, a display device is used for displaying various images. A variety of display devices have been developed including but not limited to an electroluminescent display, a liquid crystal display, a light emitting diode display, a plasma display and a quantum dot display. In an example application, a display device may be used for displaying advertisement images. Advertisement images displayed by the display device may include still images, but no moving images. A still image may be a single static image, as distinguished from a moving image.

SUMMARY

According to an exemplary embodiment of the inventive concept, there is provided a display device including: a first thin film transistor including a first semiconductor layer and a first gate electrode, the first semiconductor layer including a first channel region, a first source region, and a first drain region; a third thin film transistor including a third semiconductor layer and a third gate electrode, the third semiconductor layer including a third channel region, a third source region, and a third drain region, one of the third source region and the third drain region being electrically connected to the first gate electrode, and the other of the third source region and the third drain region being electrically connected to one of the first source region and the first drain region, wherein a leakage current of the third thin film transistor in an off-state is less than a leakage current of the first thin film transistor in the an off-state; and a pixel electrode electrically connected to one of the first source region and the first drain region, the one of the first source region and the first drain region being electrically connected to the third thin film transistor.

A grain boundary trap density of a portion of the third semiconductor layer may be less than a grain boundary trap density of the first semiconductor layer.

The grain boundary trap density of the portion of the third semiconductor layer may be about 0.2 times to about 0.5 times the grain boundary trap density of the first semiconductor layer.

A grain boundary trap density of a portion of the third channel region near the third drain region may be less than the grain boundary trap density of the first semiconductor layer.

A grain boundary trap density of the third drain region may be less than the grain boundary trap density of the first semiconductor layer.

A hydrogen concentration of a portion of the third semiconductor layer may be greater than a hydrogen concentration of the first semiconductor layer.

The hydrogen concentration of the portion of the third semiconductor layer may be about 1.5 times to about 5 times the hydrogen concentration of the first semiconductor layer.

A hydrogen concentration of a portion of the third channel region near the third drain region may be less than the hydrogen concentration of the first semiconductor layer.

A hydrogen concentration of the third drain region may be less than the hydrogen concentration of the first semiconductor layer.

A portion of the third semiconductor layer may be hydrogen-plasma treated.

A portion of the third channel region near the third drain region may be hydrogen-plasma treated.

The third drain region may be hydrogen-plasma treated.

A portion of the third semiconductor layer may be crystallized by performing excimer laser-annealing a plurality of times.

A portion of the third channel region near the third drain region may be crystallized by performing excimer laser-annealing a plurality of times.

The third drain region may be crystallized by performing excimer laser-annealing a plurality of times.

The first semiconductor layer may be located on a first layer, and the third semiconductor layer may be located on a third layer.

The third layer may overlap the first layer.

The third gate electrode may be located above the third semiconductor layer.

The display device may further include a bottom metal layer located below the third layer to correspond to the third gate electrode.

The bottom metal layer may be electrically connected to the third gate electrode.

An electric potential of the bottom metal layer may be equal to an electric potential of the third gate electrode.

According to an exemplary embodiment of the inventive concept, there is provided a display device including: a driving thin film transistor including a driving gate electrode, a driving source region, and a driving drain region; a compensation thin film transistor including a compensation gate electrode, a compensation source region, and a compensation drain region, the compensation drain region being electrically connected to the driving gate electrode, and the compensation source region being electrically connected to the driving drain region, wherein a leakage current of the compensation thin film transistor in an off-state is less than a leakage current of the driving thin film transistor in an off-state; and a pixel electrode electrically connected to the driving drain region and the compensation source region.

A grain boundary trap density of a portion of a compensation semiconductor layer of the compensation thin film transistor may be less than a grain boundary trap density of a driving semiconductor layer of the driving thin film transistor.

A hydrogen concentration of a portion of a compensation semiconductor layer of the compensation thin film transistor may be greater than a hydrogen concentration of a driving semiconductor layer of the driving thin film transistor.

According to an exemplary embodiment of the inventive concept, there is provided a display device including: a first thin film transistor including a first terminal, a second terminal, and a third terminal; a second thin film transistor including a fourth terminal, a fifth terminal, and a sixth terminal, the fifth terminal being directly connected to the first terminal, and the sixth terminal being directly connected to the second terminal, wherein a leakage current of the second thin film transistor in an off-state is less than a leakage current of the first thin film transistor in an off-state; and a pixel electrically connected to the second terminal and the sixth terminal.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
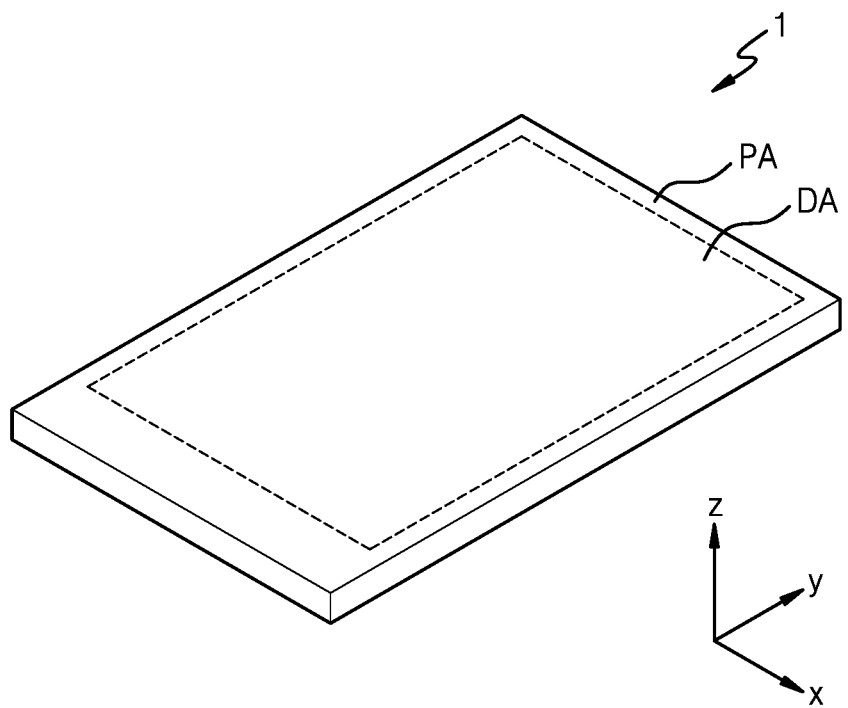
FIG. 1 is a perspective view of a portion of a display device according to an exemplary embodiment of the inventive concept.

Exemplary embodiments of the inventive concept will now be described with reference to the accompanying drawings. The inventive concept may, however, be embodied in many different forms and should not be construed as being limited to the embodiments set forth herein.

In the drawings, the same reference numerals may denote the same or corresponding elements.

It will be understood that when a layer, region, or component is referred to as being "formed on," another layer, region, or component, it can be directly formed on the other layer, region, or component, or intervening layers, regions, or components may be present. Sizes of elements in the drawings may be exaggerated or reduced for convenience of explanation.

In the following examples, the x-axis, the y-axis and the z-axis are not limited to three axes of the rectangular coordinate system. For example, the x-axis, the y-axis and the z-axis may be perpendicular to one another, or may represent different directions that are not perpendicular to one another.

FIG. 1 is a perspective view of a portion of a display device 1 according to an exemplary embodiment of the inventive concept. As shown in FIG. 1, the display device 1 according to the present embodiment may include a display area DA and a peripheral area PA. The display device 1 may include a substrate 101 (see FIG. 4). The shape of the substrate 101 is not limited to a rectangular shape (on an xy-plane) shown in FIG. 1 and may have various shapes such as a circular shape, or curved corners. In addition, the substrate 101 may have a bent area and be bent in the bent area. In other words, the substrate 101 may be flexible.

The substrate 101 may include glass or metal. In addition, the substrate 101 may include various flexible, bendable, or rollable materials. For example, the substrate 101 may include a polymer resin such as polyethersufone, polyacrylate, polyetherimide, polyethylene naphthalate, polyethylene terephthalate, polyphenylene sulfide, polyarylate, polyimide, polycarbonate, and cellulose acetate propionate.

The substrate 101 may have a multi-layered structure including two layers including the polymer resin and a barrier layer including an inorganic material therebetween. Various modifications may be made. For example, the barrier layer may include silicon oxide, silicon nitride, and silicon oxynitride.

A plurality of display elements may be located in the display area DA. For example, the display element may include an organic light-emitting diode OLED and emit red, green, blue, or white light. A (sub)-pixel located in the display area DA of the display device 1 includes the organic light-emitting diode OLED and also includes a thin film transistor and a capacitor, etc, that control an emission degree, etc. of the organic light-emitting diode OLED. The display area DA may be an area for displaying images in the display device 1.

A driver, a power supply line, etc. may be arranged in the peripheral area PA. In addition, the peripheral area PA may include a pad area which is a region in which various electronic elements such as a driving integrated circuit or a printed circuit board, etc. are electrically attached. Images may not be displayed in the peripheral area PA.

Figure 2:
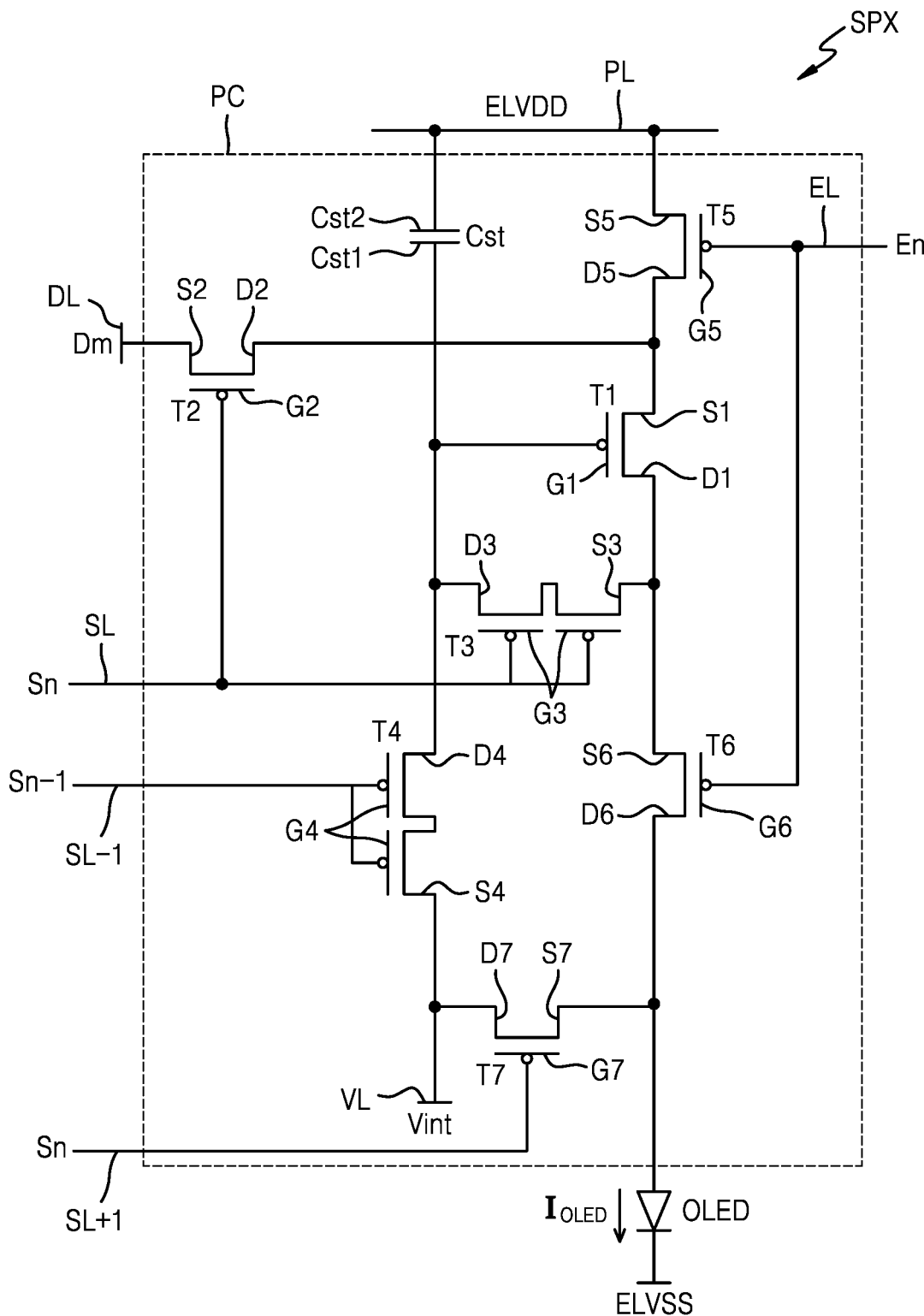
FIG. 2 is an equivalent circuit diagram of a (sub)-pixel included in the display device of FIG. 1 according to an exemplary embodiment of the inventive concept.

FIG. 2 is an equivalent circuit diagram of a (sub)-pixel located in the display area DA of the display device 1 of FIG. 1 according to an exemplary embodiment of the inventive concept. A pixel circuit PC located in one (sub)-pixel SPX may include a plurality of thin film transistors T1, T2, T3, T4, T5, T6, and, T7 and a storage capacitor Cst. The thin film transistors T1, T2, T3, T4, T, T6, and, T7 and the storage capacitor Cst may be connected to signal lines SL, SL−1, SL+1, EL, and DL, a initialization voltage line VL including a first initialization voltage line VL1 (see FIG. 3) and a second initialization voltage line VL2 (see FIG. 3), and a driving voltage line PL.

Figure 3:
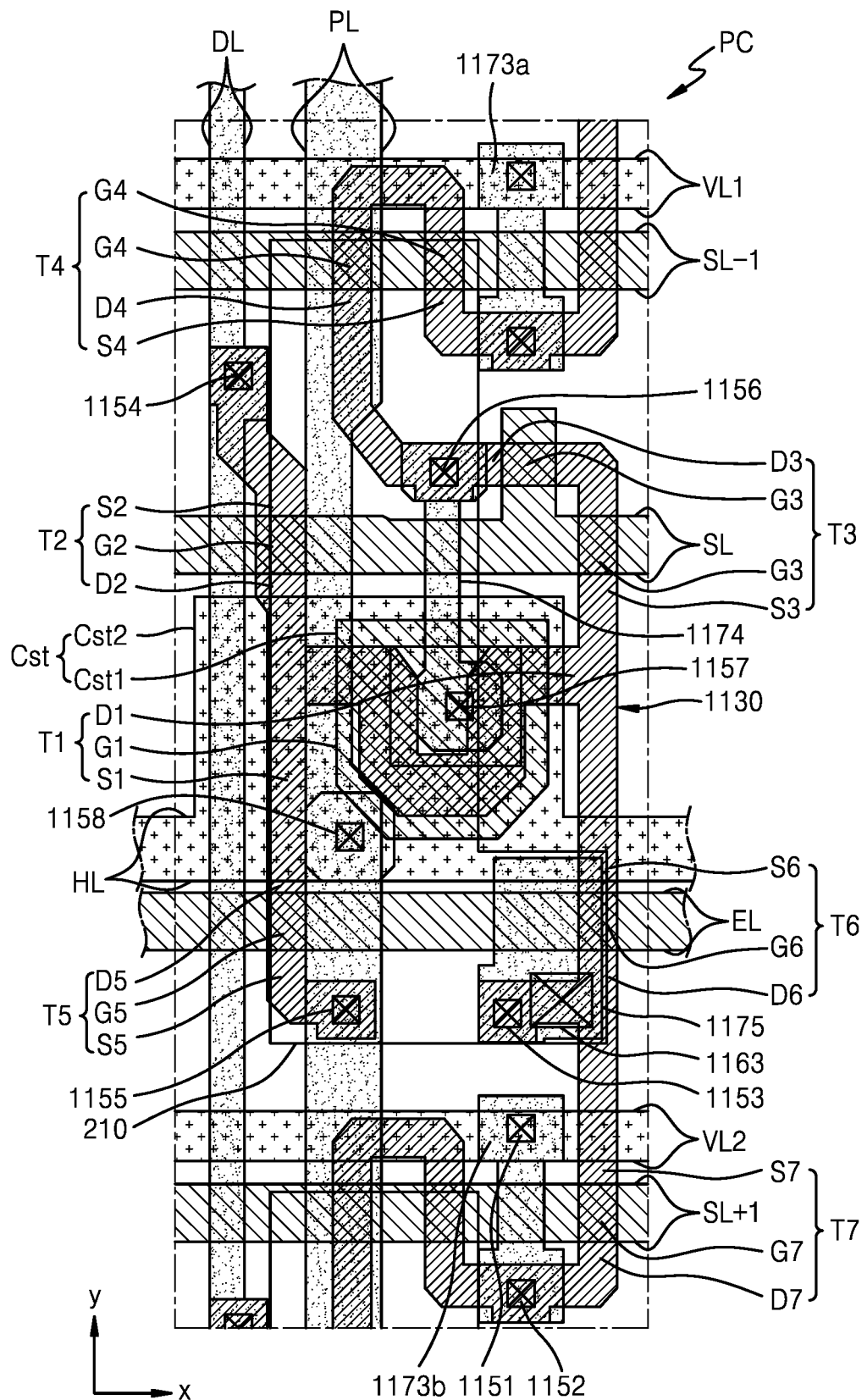
FIG. 3 is an arrangement view showing locations of a plurality of thin film transistors, a capacitor, etc. in the (sub)-pixel of FIG. 2 according to an exemplary embodiment of the inventive concept.

The signal lines SL, SL−1, SL+1, EL, and DL may include the scan line SL, the previous scan line SL−1, the next scan line SL+1, the emission control line EL, and the data line DL. For example, the scan line SL transfers a scan signal Sn, the previous scan line SL−1 transfers a previous scan signal Sn−1 to the first initialization thin film transistor T4, the next scan line SL+1 transfers a scan signal Sn to the second initialization thin film transistor T7, the emission control line EL transfers an emission control signal En to the operation control thin film transistor T5 and the emission control thin film transistor T6, and the data line DL intersects the scan line SL (as shown in FIG. 3) and transfers a data signal Dm. The driving voltage line PL may transfer a driving voltage ELVDD to the driving thin film transistor T1, the first initialization voltage line VL1 may transfer an initialization voltage Vint to the first initialization thin film transistor T4, and the second initialization voltage line VL2 may transfer the initialization voltage Vint to the second initialization thin film transistor T7.

A driving gate electrode G1 of the driving thin film transistor T1 is connected to a bottom electrode Cst1 of the storage capacitor Cst, a driving source region S1 of the driving thin film transistor T1 is connected to the driving voltage line PL through the operation control thin film transistor T5, and a driving drain region D1 of the driving thin film transistor T1 is electrically connected to a pixel electrode of an organic light-emitting diode OLED through the emission control thin film transistor T6. The driving thin film transistor T1 receives a data signal Dm depending on a switching operation of the switching thin film transistor T2 and supplies a driving current lom to the organic light-emitting diode OLED.

A switching gate electrode G2 of the switching thin film transistor T2 is connected to the scan line SL, a switching source region S2 of the switching thin film transistor T2 is connected to the data line DL, and a switching drain region D2 of the switching thin film transistor T2 is connected to the driving source region S1 of the driving thin film transistor T1 and to the driving voltage line PL through the operation control thin film transistor T5. The switching thin film transistor T2 is turned on in response to a scan signal Sn transferred through the scan line SL and performs a switching operation for transferring a data signal Dm transferred through the data line DL to the driving source region S1 of the driving thin film transistor T1.

A compensation gate electrode G3 of the compensation thin film transistor T3 is connected to the scan line SL, a compensation source region S3 of the compensation thin film transistor T3 is connected to the driving drain region D1 of the driving thin film transistor T1 and to the pixel electrode of the organic light-emitting diode OLED through the emission control thin film transistor T6, and a compensation drain region D3 of the compensation thin film transistor T3 is connected to the bottom electrode Cst1 of the storage capacitor Cst, a first initialization drain region D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 of the driving thin film transistor T1 to the driving drain region D1 of the driving thin film transistor T1. The compensation gate electrode G3 of the compensation thin film transistor T3 may be a dual-gate electrode. The compensation drain region D3 may be directly connected with the driving gate electrode G1 of the driving thin film transistor T1 and the compensation source region S3 may be directly connected with the driving drain region D1 of the driving thin film transistor T1.

A first initialization gate electrode G4 of the first initialization thin film transistor T4 is connected to the previous scan line SL−1, a first initialization source region S4 of the first initialization thin film transistor T4 is connected to the first initialization voltage line VL1, and a first initialization drain region D4 of the first initialization thin film transistor T4 is connected to the bottom electrode Cst1 of the storage capacitor Cst, the compensation drain region D3 of the compensation thin film transistor T3, and the driving gate electrode G1 of the driving thin film transistor T1. The first initialization thin film transistor T4 is turned on in response to a previous scan signal Sn−1 transferred through the previous scan line SL−1 and performs an initialization operation to initialize a voltage of the driving gate electrode G1 of the driving thin film transistor T1 by transferring the initialization voltage Vint to the driving gate electrode G1 of the driving thin film transistor T1. The first initialization gate electrode G4 of the first initialization thin film transistor T4 may be a dual-gate electrode.

An operation control gate electrode G5 of the operation control thin film transistor T5 is connected to the emission control line EL, an operation control source region S5 of the operation control thin film transistor T5 is connected to the driving voltage line PL, and an operation control drain region D5 of the operation control thin film transistor T5 is connected to the driving source region S1 of the driving thin film transistor T1, and the switching drain region D2 of the switching thin film transistor T2.

An emission control gate electrode G6 of the emission control thin film transistor T6 is connected to the emission control line EL, an emission control source region S6 of the emission control thin film transistor T6 is connected to the driving drain region D1 of the driving thin film transistor T1 and the compensation source region S3 of the compensation thin film transistor T3, and an emission control drain region D6 of the emission control thin film transistor T6 is electrically connected to the second initialization source region S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL. In this case, the driving voltage ELVDD is transferred to the organic light-emitting diode OLED, and the driving current $I_{OLED}$ flows through the organic light-emitting diode OLED.

A second initialization gate electrode G7 of the second initialization thin film transistor T7 is connected to the next scan line SL+1, a second initialization source region S7 of the second initialization thin film transistor T7 is connected to the emission control drain region D6 of the emission control thin film transistor T6 and the pixel electrode of the organic light-emitting diode OLED, and a second initialization drain region D7 of the second initialization thin film transistor T7 is connected to the second initialization voltage line VL2.

Since the scan line SL is electrically connected to the next scan line SL+1, the same scan signal Sn may be applied to the scan line SL and the next scan line SL+1. Therefore, the second initialization thin film transistor T7 may be turned on in response to a scan signal Sn transferred through the next scan line SL+1 and may perform an operation of initializing the pixel electrode of the organic light-emitting diode OLED.

A top electrode Cst2 of the storage capacitor Cst is connected to the driving voltage line PL, and a common electrode of the organic light-emitting diode OLED is connected to a common voltage ELVSS. Therefore, the organic light-emitting diode OLED may display an image by receiving the driving current $I_{OLED}$ from the driving thin film transistor T1 and emitting light.

Though it is shown in FIG. 2 that the compensation thin film transistor T3 and the first initialization thin film transistor T4 each have a dual gate electrode, the compensation thin film transistor T3 and the first initialization thin film transistor T4 each may have one gate electrode.

Figure 4:
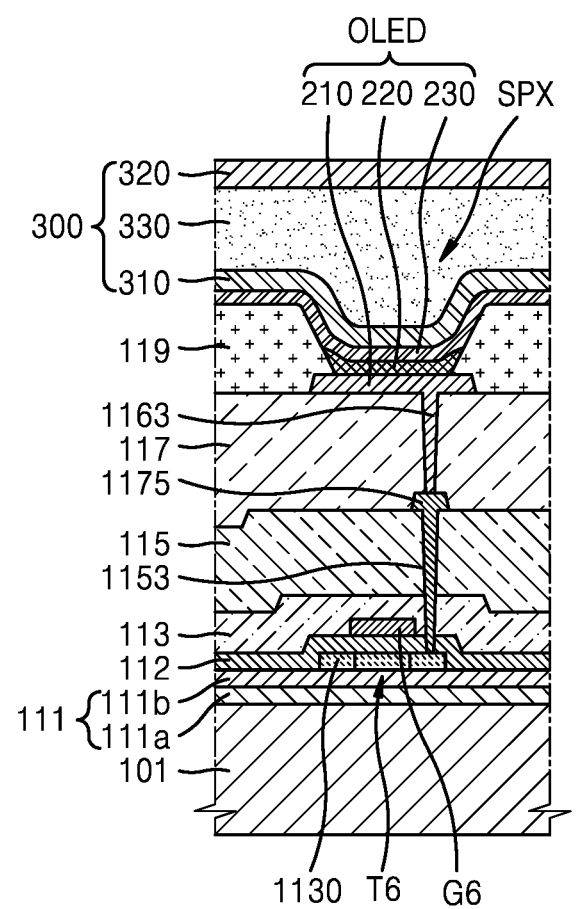
FIG. 4 is a cross-sectional view of a portion of the display device of FIG. 3 according to an exemplary embodiment of the inventive concept.

FIG. 3 is an arrangement view of locations of a plurality of thin film transistors and a capacitor, etc. in the (sub)-pixel of FIG. 2 according to an exemplary embodiment of the inventive concept, and FIG. 4 is a cross-sectional view of a portion of the display device of FIG. 3 according to an exemplary embodiment of the inventive concept.

The driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are arranged along a semiconductor layer 1130. Some regions of the semiconductor layer 1130 may constitute semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. In other words, some regions of the semiconductor layer 1130 may constitute a channel region, a source region, or a drain region of a thin film transistor.

The semiconductor layer 1130 may be formed over the substrate 101. A buffer layer 111 may be formed on the substrate 101, and the semiconductor layer 1130 may be formed on the buffer layer 111.

The buffer layer 111 may reduce or block the penetration of foreign substances, moisture, or external air from below the substrate 101 and provide a flat surface on the substrate 101. The buffer layer 111 may include an inorganic material such as an oxide or a nitride, an organic material, or an organic/inorganic composite material and include a single-layered structure or a multi-layered structure of the inorganic material and the organic material. For example, the buffer layer 111 may have a structure in which a first buffer layer 111a and a second buffer layer 111b are stacked. The first buffer layer 111a may be indirect contact with the substrate 101. In this case, the first buffer layer 111a may include a material different from that of the second buffer layer 111b. For example, the first buffer layer 111a may include silicon nitride and the second buffer layer 111b may include silicon oxide.

As described above, in the case where the first buffer layer 111a includes silicon nitride, hydrogen may be included while forming silicon nitride. Since a carrier mobility of the semiconductor layer 1130 formed on the buffer layer 111 is improved, an electric characteristic of a thin film transistor (TFT) may be improved. In addition, the semiconductor layer 1130 may include a silicon material and may be disposed directly on the second buffer layer 111b. In this case, since an interface bonding characteristic between the semiconductor layer 1130 including silicon and the second buffer layer 111b containing silicon oxide is improved, an electric characteristic of a thin film transistor may be improved.

The semiconductor layer 1130 may include a low temperature polycrystalline silicon (LTPS). Since the polycrystalline silicon has a high electron mobility (100 cm$^2$Ns or more), the polycrystalline silicon has low energy power consumption and high reliability. In another example, the semiconductor layer 1130 may include amorphous silicon (a-Si) and/or an oxide semiconductor. Alternatively, some semiconductor layers of the plurality of thin film transistors may include an LTPS, and other semiconductor layers may include a-Si and/or an oxide semiconductor.

A first gate insulating layer 112 is located on the semiconductor layer 1130. The scan line SL, the previous scan line SL−1, the next scan line SL+1, and the emission control line EL may be located on the first gate insulating layer 112.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

Regions of the scan line SL that overlap the channel regions of the switching and compensation thin film transistors T2 and T3 may respectively include the switching and compensation gate electrodes G2 and G3, a region of the previous scan line SL−1 that overlaps the channel region of the first initialization thin film transistor T4 may include the first initialization gate electrode G4, and a region of the next scan line SL+1 that overlaps the channel region of the second initialization thin film transistor T7 may include the second initialization gate electrode G7. In addition, regions of the emission control line EL that overlap the operation control thin film transistor T5 and the emission control thin film transistor T6 may respectively include the operation control gate electrode G5 and the emission control gate electrode G6.

A second gate insulating layer 113 may be provided on the scan line SL, the previous scan line SL−1, the next scan line SL+1, and the emission control line EL. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 113 may cover the emission control gate electrode G6 of the emission control thin film transistor T6.

An electrode voltage line HL, the first initialization voltage line VL1, and the second initialization voltage line VL2 may be arranged on the second gate insulating layer 113. The electrode voltage line HL may cover at least a portion of the driving gate electrode G1 of the driving thin film transistor T1 and constitute the storage capacitor Cst in cooperation with the driving gate electrode G1 of the driving thin film transistor T1.

The bottom electrode Cst1 of the storage capacitor Cst may be formed as one body with the driving gate electrode G1 of the driving thin film transistor T1. For example, the driving gate electrode G1 of the driving thin film transistor T1 may serve as the bottom electrode Cst1 of the storage capacitor Cst. A region of the electrode voltage line HL that overlaps the driving gate electrode G1 may include the top electrode Cst2 of the storage capacitor Cst. Therefore, the second gate insulating layer 113 may serve as a dielectric layer of the storage capacitor Cst.

An interlayer insulating layer 115 is located on the electrode voltage line HL, the first initialization voltage line VL1, and the second initialization voltage line VL2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The data line DL, the driving voltage line PL, first and second initialization connection lines 1173a and 1173b, a node connection line 1174, and a connection metal 1175 may be arranged on the interlayer insulating layer 115. The first and second initialization connection lines 1173a and 1173b may be spaced apart from each other along a y direction shown in FIG. 3. The data line DL and the driving voltage line PL may be adjacent to each other and extend along the y direction. The data line DL, the driving voltage line PL, the node connection line 1174, and the connection metal 1175 may include a conductive material including molybdenum (Mo), aluminum (Al), copper (Cu), and titanium (Ti) and have a single-layered structure or a multi-layered structure including the above materials. For example, the data line DL, the driving voltage line PL, the node connection line 1174, and the connection metal 1175 may have a multi-layered structure of Ti/Al/Ti.

The data line DL may be connected to the switching source region S2 of the switching thin film transistor T2 through a contact hole 1154. A portion of the data line DL may include the switching source region S2 of the switching thin film transistor T2.

The driving voltage line PL may be connected to the top electrode Cst2 of the storage capacitor Cst through a contact hole 1158 formed in the interlayer insulating layer 115. Therefore, the electrode voltage line HL may have the same voltage level (e.g., a constant voltage) as that of the driving voltage line PL. In addition, the driving voltage line PL may be connected to the operation control drain region D5 of the operation control thin film transistor T5 through a contact hole 1155.

The first initialization voltage line VIA may be connected to the first initialization thin film transistor T4 through the first initialization connection line 1173a, and the second initialization voltage line VL2 may be electrically connected to the second initialization thin film transistor T7 through the second initialization connection line 1173b and via holes 1151 and 1152. The first initialization voltage line VL1 may have the same constant voltage (e.g., −2 V) as that of the second initialization voltage line VL2.

One end of the node connection line 1174 may be connected to the compensation drain region D3 of the compensation thin film transistor T3 through a contact hole 1156, and another end of the node connection line 1174 may be connected to the driving gate electrode G1 of the driving thin film transistor T1 through a contact hole 1157.

The connection metal 1175 may be connected to a semiconductor layer 1130 of the emission control thin film transistor T6 through a contact hole 1153 passing through the interlayer insulating layer 115, the second gate insulating layer 113, and the first gate insulating layer 112. The emission control thin film transistor T6 may be electrically connected to a pixel electrode 210 of the organic light-emitting diode OLED through the connection metal 1175. For example, the pixel electrode 210 of the organic light-emitting diode OLED and the connection metal 1175 may be in contact with each other at a top side of the interlayer insulating layer 115.

A planarization layer 117 may be located on the data line DL, the driving voltage line PL, the first and second initialization connection lines 1173a and 1173b, the node connection line 1174, and the connection metal 1175. The organic light-emitting diode OLED may be located on the planarization layer 117.

Though a structure of one pixel circuit PC is described in FIGS. 2 and 3, a plurality of sub-pixels SPX each having the same pixel circuit PC may be arranged in a first direction (an x-axis direction) and a second direction (a y-axis direction). In this case, the first initialization voltage line VL1, the previous scan line SL−1, the second initialization voltage line VL2, and the next scan line SL+1 may be shared by two pixel circuits PC abutting each other in the second direction (the y-axis direction).

In other words, the first initialization voltage line VL1 and the previous scan line SL−1 may be electrically connected to the second initialization thin film transistor T7 of another pixel circuit PC arranged over the pixel circuit PC shown in FIG. 3 in the second direction (the y-axis direction). Therefore, a previous scan signal applied to the previous scan line SL−1 may be transferred, as a next scan signal, to the second initialization thin film transistor T7 of the other pixel circuit PC. In addition, the second initialization voltage line VL2 and the next scan line SL+1 may be electrically connected to the first initialization thin film transistor T4 of another pixel circuit PC that abuts below the pixel circuit PC shown in FIG. 3 in the second direction (the y-axis direction). In this case, a previous scan signal and the initialization voltage may be transferred to the first initialization thin film transistor T4 of the other pixel circuit PC.

Referring to FIG. 4 again, the planarization layer 117 may have a flat top surface such that the pixel electrode 210 is formed flat. The planarization layer 117 may include an organic material and include a single-layered structure or a multi-layered structure. The planarization layer 117 may include a polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). In the case where the planarization layer 117 includes an inorganic material, chemical planarization polishing may be performed. The planarization layer 117 may include both an organic material and an inorganic material.

The organic light-emitting diode OLED may include a pixel electrode 210, a common electrode 230, and an intermediate layer 220 therebetween, the intermediate layer 220 including an emission layer.

The pixel electrode 210 may be connected to the connection metal 1175 through a contact hole 1163, and the connection metal 1175 may be connected to the emission control drain region D6 of the emission control thin film transistor T6 through the contact hole 1153. The pixel electrode 210 may include a (semi) transparent electrode or a reflective electrode. In an exemplary embodiment of the inventive concept, the pixel electrode 210 may include a reflective layer and a transparent or semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment of the inventive concept, the pixel electrode 210 may include a stacked structure of ITO/Ag/ITO.

A pixel-defining layer 119 may be arranged on the planarization layer 117. The pixel-defining layer 119 may define an emission area of a pixel by including an opening that exposes the central portion of the pixel electrode 210. The pixel-defining layer 119 may prevent an arc, etc. from occurring at the edges of the pixel electrode 210, by increasing a distance between the edges the pixel electrode 210 and the common electrode 230 over the pixel electrode 210. The pixel-defining layer 119 may include an organic insulating material including polyimide, polyamide, an acrylic resin, benzocyclobutene (BCB), hexamethyldisiloxane (HMDSO), and a phenolic resin and be formed by spin coating.

The intermediate layer 220 may include an organic emission layer. The organic emission layer may include an organic material including a fluorescent material or a phosphorescent material emitting red, green, blue, or white light. The organic emission layer may include a low molecular weight organic material or a polymer material. A functional layer may be arranged under and/or on the organic emission layer, the functional layer including a hole transport layer (HTL), a hole injection layer (HIL), an electron transport layer (ETL), and an electron injection layer (EIL). The intermediate layer 220 may be arranged to respectively correspond to a plurality of pixel electrodes 210. However, the intermediate layer 220 is not limited thereto and a layer such as an HTL, an HIL, an ETL, or an EIL among layers included in the intermediate layer 220 may be formed as one body over a plurality of pixel electrodes 210.

The common electrode 230 may include a transparent electrode or a reflective electrode. In an exemplary embodiment of the inventive concept, the common electrode 230 may include a transparent electrode or a semi-transparent electrode and include a metal thin layer having a small work function including Li, Ca, lithium fluoride (LiF)/Ca, LiF/Al, Ag, Mg, and a compound thereof. In addition, the common electrode 230 may further include a transparent conductive oxide (TCO) layer including ITO, IZO, ZnO, or $In_2O_3$. The common electrode 230 may be formed as one body to correspond to the plurality of pixel electrodes 210.

An encapsulation layer 300 may be located on the common electrode 230, the encapsulation layer 300 including a first inorganic encapsulation layer 310, a second inorganic encapsulation layer 320, and an organic encapsulation layer 330 therebetween.

The first inorganic encapsulation layer 310 and the second inorganic encapsulation layer 320 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer 330 may include polyethylene terephthalate, polyethylene naphthalate, polycarbonate, polyimide, polyethylene sulfonate, polyoxymethylene, polyarylate, hexamethyldisiloxane (HMDSO), an acrylic resin (e.g., polymethylmethacrylate (PMMA), poly acrylic acid, etc.), or any combination thereof.

In the display device according to the present embodiment, one of the compensation source region S3 (e.g., a third source region) and the compensation drain region D3 (e.g., a third drain region) of the compensation thin film transistor T3 is electrically connected to the driving gate electrode G1 (e.g., a first gate electrode) of the driving thin film transistor T1, and the other of the compensation source region S3 and the compensation drain region D3 is electrically connected to one of the driving source region S1 (e.g., a first source region) and the driving drain region D1 (e.g., a first drain region) of the driving thin film transistor T. The compensation thin film transistor T3 may be the third thin film transistor described above and the driving thin film transistor T1 may be the first thin film transistor described above. The pixel electrode 210 is electrically connected to one of the driving source region S1 and the driving drain region D1 of the driving thin film transistor T1, the one of the driving source region S1 and the driving drain region D1 of the driving thin film transistor T1 being connected to the compensation thin film transistor T3. In addition, a leakage current amount of the compensation thin film transistor T3 in an off-state is less than a leakage current amount of the driving thin film transistor T1 in an off-state. For example, a leakage current amount of the compensation thin film transistor T3 may be about $1.1 \times 10^{-15}$ A, and a leakage current amount of the driving thin film transistor T1 may be about $1.4 \times 10^{-15}$ A.

Figure 5:
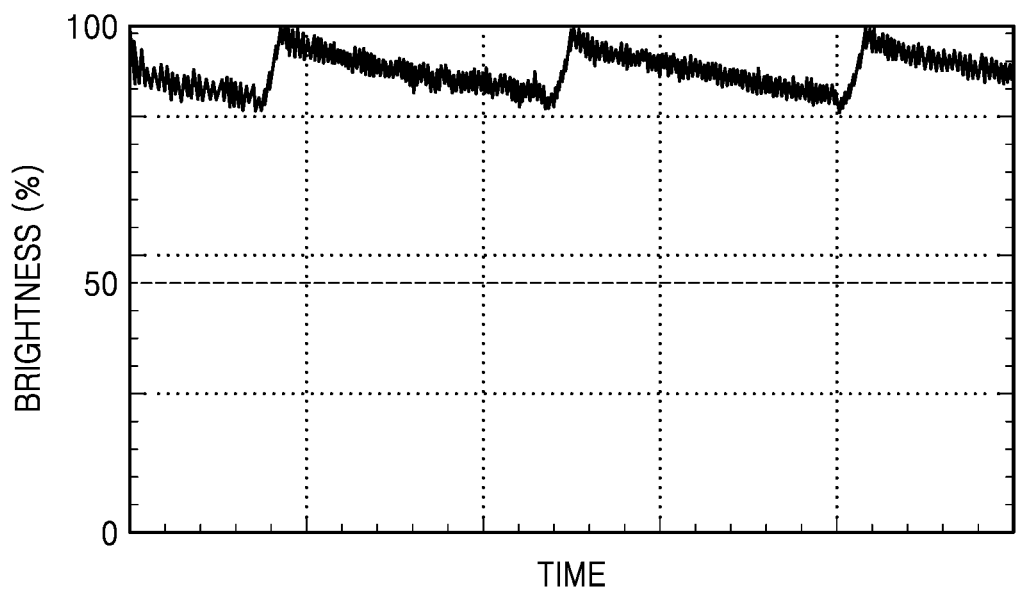
FIG. 5 is a graph showing a brightness change versus time in a display device according to a comparative example.

FIG. 5 is a graph showing a brightness change versus time in a display device according to a comparative example. Generally, a display device displays a moving image at 60 Hz per second. However, in the case of displaying a still image, such as a static non-moving advertisement, etc., the display device may display the still image at a frequency less than 60 Hz per second. However, even when displaying the still image at a low frequency, in the display device according to a comparative example, flickering occurs on its screen.

FIG. 5 shows a brightness change while the display device displays the still image at 30 Hz per second. FIG. 5 shows brightness at around 100 when a frame starts and over time the brightness is reduced until the frame ends. Then, when the next frame starts the brightness again goes close to 100. This increase in brightness at the start of a new frame causes flickering to occur on a screen. More specifically, there is a large brightness change because a leakage current occurs in the compensation thin film transistor T3 and thus a voltage of the driving gate electrode G1 of the driving thin film transistor T1 that is connected to the compensation source region S3 or the compensation drain region D3 of the compensation thin film transistor T3 changes. Consequently, a current amount applied to the organic light-emitting diode OLED through the driving thin film transistor T1 is reduced and thus the brightness is reduced.

Figure 6:
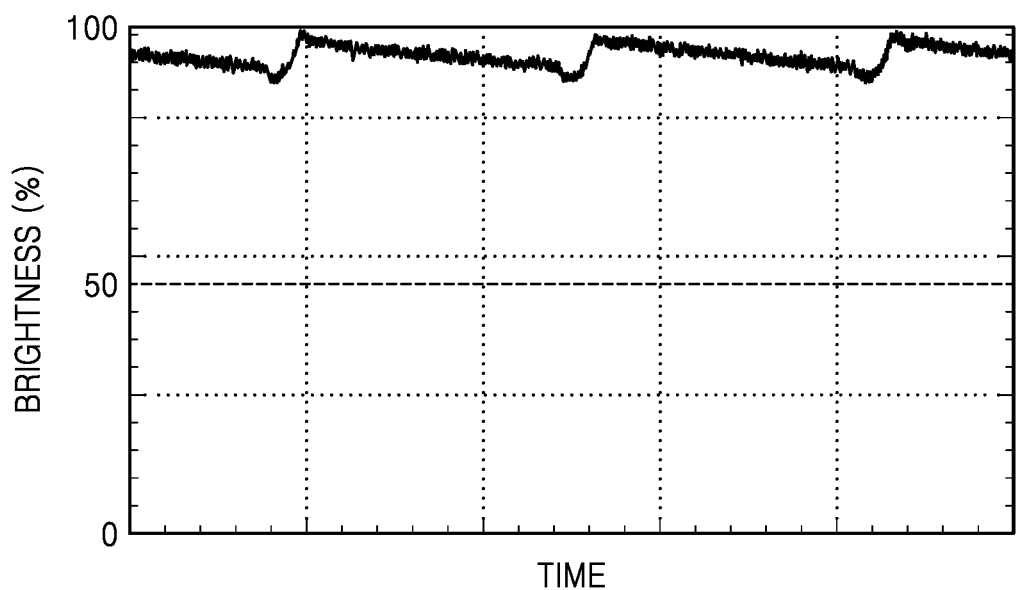
FIG. 6 is a graph showing a brightness change versus time in a display device according to an exemplary embodiment of the inventive concept.

FIG. 6 is a graph showing a brightness change versus time in a display device according to an exemplary embodiment of the inventive concept. Compared to FIG. 5, a brightness change in FIG. 6 is relatively very small. Therefore, even when a still image is displayed at a low frequency, flickering is minimized or not perceivable in the display device according to the present embodiment. This is because a leakage current amount of the compensation thin film transistor T3 in an off-state is less than a leakage current amount of the driving thin film transistor T1 in an off-state.

Figure 7:
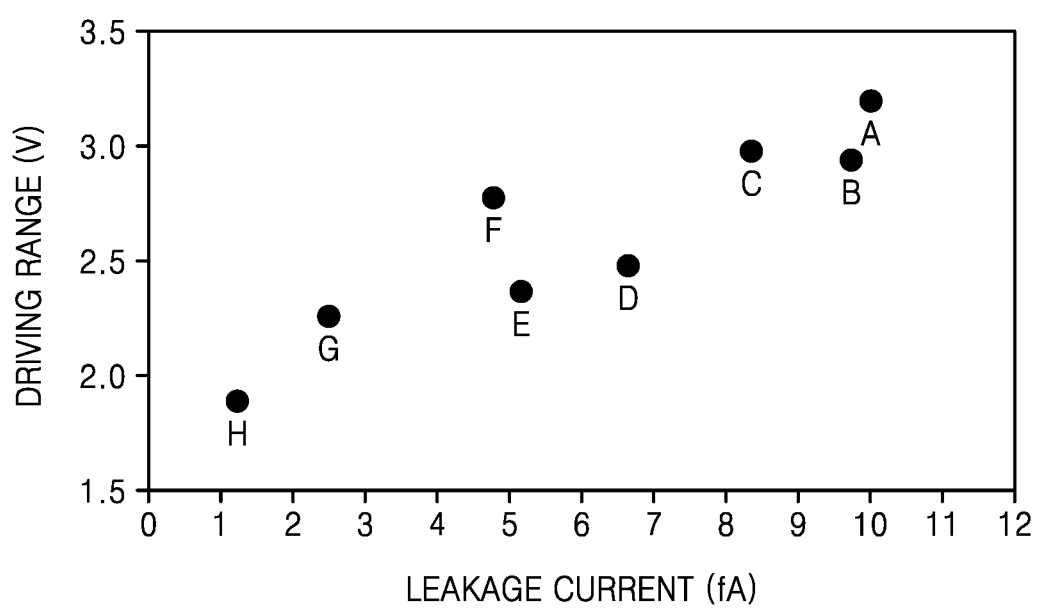
FIG. 7 is a graph showing a relationship between a leakage current and a driving range.

FIG. 7 is a graph showing a relationship between a leakage current and a driving range. A horizontal axis represents a leakage current of a thin film transistor in units of fA and a vertical axis represents a driving range of a thin film transistor in units of V. The driving range denotes the range of a gate voltage that adjusts a current amount flowing between a source electrode and a drain electrode of a thin film transistor. The current amount flowing between the source electrode and the drain electrode of the thin film transistor is adjusted by adjusting a voltage (e.g., the gate voltage) between the source electrode and the drain electrode of the thin film transistor.

As shown in FIG. 7, a leakage current tends to be proportional to a driving range. In other words, when a leakage current becomes small, a driving range becomes narrow. For example, as shown in FIG. 7, when the leakage current is denoted by H, the driving range is around 2.0 V, when the leakage current is denoted by G, the driving range is around 2.3 V, when the leakage current is denoted by F, the driving range is around 2.8 V and when the leakage current is denoted by C, the driving range is around 3 V. Since the driving thin film transistor T1 adjusts the brightness of light emitted from the organic light-emitting diode OLED by controlling a current amount flowing through the organic light-emitting diode OLED, the driving range thereof should be wide. In contrast, the compensation thin film transistor T3 is designed to compensate for a threshold voltage of the driving thin film transistor T1. Since only on-off of the compensation thin film transistor T3 is required, the driving range of the compensation thin film transistor T3 does not have to be wide.

Therefore, in the display device according to an exemplary embodiment of the inventive concept, an influence on the driving gate electrode G1 of the driving thin film transistor T1 may be minimized by reducing a leakage current amount of the compensation thin film transistor T3 in an off-state (compared to a leakage current amount of the driving thin film transistor T1 in an off-state). Therefore, flickering of the screen may be minimized. In addition, a fine brightness change of a displayed image may be represented in a wide range by widening the driving range of the driving thin film transistor T1.

To make a leakage current amount of the compensation thin film transistor T3 in an off-state less than a leakage current amount of the driving thin film transistor T1 in an off-state, a grain boundary trap density of at least a portion of a compensation semiconductor layer (e.g., a third semiconductor layer) may be made less than a grain boundary trap density of a driving semiconductor layer (e.g., a first semiconductor layer). The compensation semiconductor layer may include the compensation source region S3, the compensation drain region D3, and the compensation channel region therebetween of the compensation thin film transistor T3. The driving semiconductor layer may include the driving source region S1, the driving drain region D1, and the driving channel region therebetween of the driving thin film transistor T1. A grain boundary trap density (e.g., Ntrap) may include a density of an electric defect, an uncoupled bond density of a semiconductor layer, and a dangling bond density. When a grain boundary trap density is reduced, a leakage current is reduced. A grain boundary trap density of at least a portion of the compensation semiconductor layer of the compensation thin film transistor T3 may be made about 0.2 times to about 0.5 times a grain boundary trap density of the driving semiconductor layer of the driving thin film transistor T1. In other words, the grain boundary trap density of at least a portion of the compensation semiconductor layer of the compensation thin film transistor T3 may be less than the grain boundary trap density of the driving semiconductor layer of the driving thin film transistor T1.

The leakage current may be generated by a charge generated from a portion of the channel region of the semiconductor layer that abuts the drain region. Therefore, a grain boundary trap density of a portion of the compensation channel region (e.g., the third channel region) that abuts the compensation drain region D3 (e.g., the third drain region) may be made less than a grain boundary trap density of the driving semiconductor layer (e.g., the first semiconductor layer). This way, an amount of a leakage current generated from the compensation thin film transistor T3 may be reduced. Alternatively, a grain boundary trap density of the compensation drain region D3 (e.g., the third drain region) may be made less than a grain boundary trap density of the driving semiconductor layer (e.g., the first semiconductor layer). This way, an amount of a leakage current generated from the compensation thin film transistor T3 may be reduced.

In the display device according to an exemplary embodiment of the inventive concept, a hydrogen concentration of at least a portion of the compensation semiconductor layer may be made greater than a hydrogen concentration of the driving semiconductor layer. For example, a hydrogen concentration of at least a portion of the compensation thin film transistor T3 may be about 1.5 times to about 5 times a hydrogen concentration of the driving semiconductor layer.

As described above, a grain boundary trap density (e.g., Ntrap) may include an uncoupled bond density of a semiconductor layer. A high hydrogen concentration of a semiconductor layer may mean that an uncoupled bond density is low. This is because an uncoupled bond couples to hydrogen and thus an uncoupled bond density becomes low. Consequently, a high hydrogen concentration of a semiconductor layer means that a grain boundary trap density is low and thus brightness reduction shown in FIG. 5 is not represented. In other words, a large reduction in brightness does not occur in a display device of the present embodiment.

The leakage current may be generated by a charge generated from a portion of the channel region of the semiconductor layer that abuts the drain region. Therefore, a hydrogen concentration of the compensation channel region (e.g., the third channel region) that abuts the compensation drain region D3 (e.g., the third drain region) may be made less than a hydrogen concentration of the driving semiconductor layer (e.g., the first semiconductor layer). This way, an amount of a leakage current generated from the compensation thin film transistor T3 may be reduced. Alternatively, a hydrogen concentration of the compensation drain region D3 (e.g., the third drain region) may be made less than a hydrogen concentration of the driving semiconductor layer (e.g., the first semiconductor layer). This way, an amount of a leakage current generated from the compensation thin film transistor T3 may be reduced.

To allow the hydrogen concentration of at least a portion of the compensation semiconductor layer to be about 1.5 times to 5 times the hydrogen concentration of the driving semiconductor layer, a hydrogen-plasma treatment may be performed on at least a portion of the compensation semiconductor layer. By doing so, since hydrogen is coupled to a dangling bond of the compensation semiconductor layer by the hydrogen-plasma treatment, a hydrogen concentration of a predetermined region of the compensation semiconductor layer is raised and a grain boundary trap density is reduced, and thus, the magnitude of a leakage current may be reduced.

Figure 8:
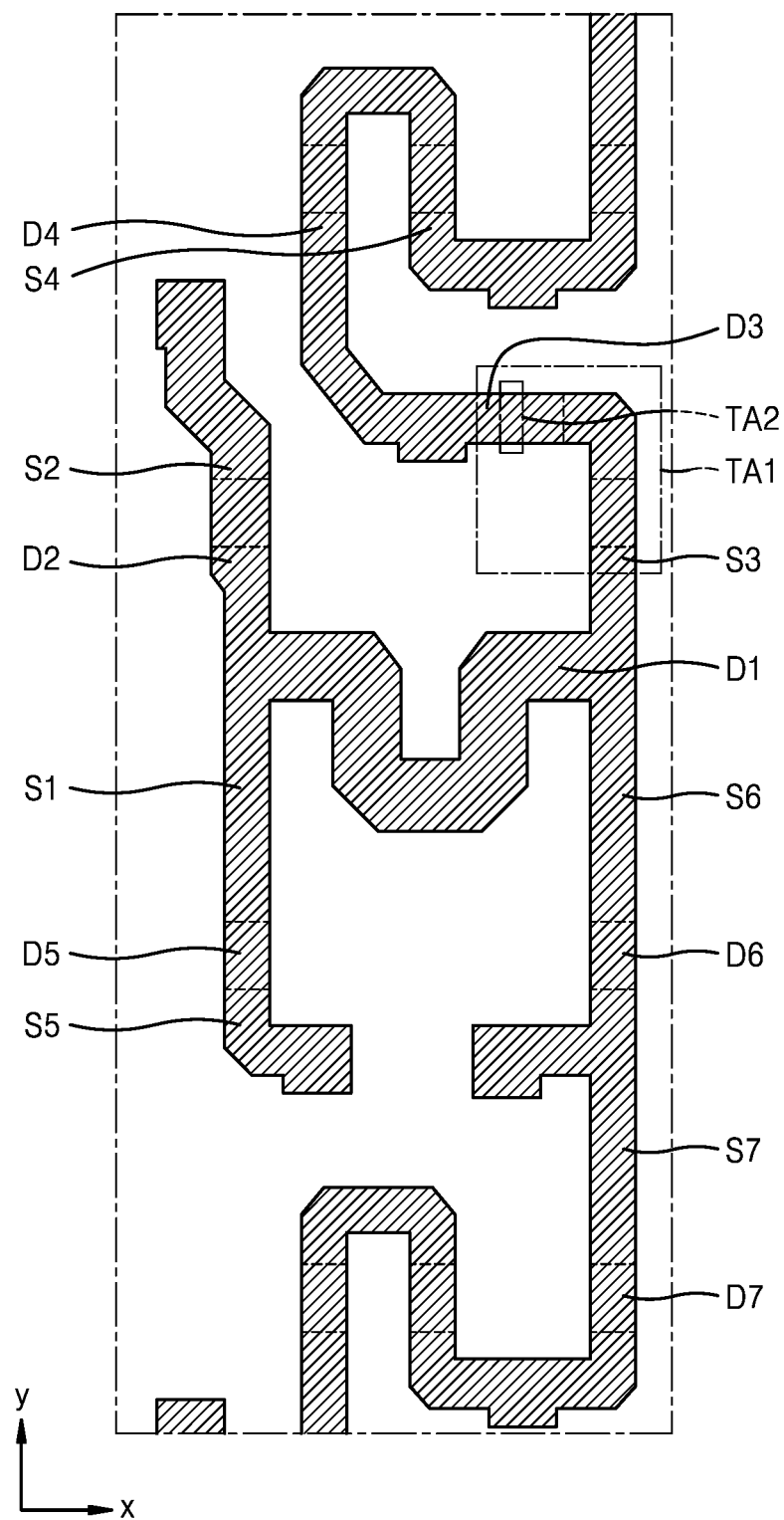
FIG. 8 is an arrangement view of a layer of elements such as the plurality of thin film transistors, the capacitor, etc. of FIG. 3 according to an exemplary embodiment of the inventive concept.

The hydrogen-plasma treatment may be performed over an entire region of the compensation semiconductor layer as denoted by a region TA1 of FIG. 8. For example, the hydrogen-plasma treatment may be performed on the compensation drain region D3, the compensation source region S3 and the compensation channel region between the compensation drain region D3 and the compensation source region S3. In addition, the hydrogen-plasma treatment may be performed on a portion of the compensation channel region that abuts the compensation drain region D3 as denoted by a region TA2 of FIG. 8. Alternatively, the hydrogen-plasma treatment may be performed on the compensation drain region D3 of the compensation semiconductor layer. The hydrogen-plasma treatment may not be performed on the driving semiconductor layer. In fact, the hydrogen-plasma treatment may be minimally performed where possible. This can further widen the driving range of the driving thin film transistor T1.

In addition, at least a portion of the compensation semiconductor layer of the compensation thin film transistor T3 may be crystallized by performing excimer-laser annealing a plurality of times. This is done because, when excimer-laser annealing is performed a plurality of times, a leakage current of a thin film transistor is reduced. Particularly, a portion of the compensation channel region that abuts the compensation drain region D3 may be crystallized by performing excimer-laser annealing a plurality of times. In the alternative, the excimer-laser annealing may be performed on the compensation drain region D3 of the compensation semiconductor layer a plurality of times.

Furthermore, at least a portion of the compensation semiconductor layer of the compensation thin film transistor T3 may be crystallized by performing excimer-laser annealing. In addition, the at least a portion of the compensation semiconductor layer of the compensation thin film transistor T3 may be hydrogen-plasma treated. Particularly, after a portion of the compensation channel region that abuts the compensation drain region D3 is crystallized by performing the excimer-laser annealing a plurality of times, the hydrogen-plasma treatment may be performed thereon. In the alternative, the excimer-laser annealing may be performed a plurality of times and the hydrogen-plasma treatment may be performed on the compensation drain region D3 of the compensation semiconductor layer.

Figure 9:
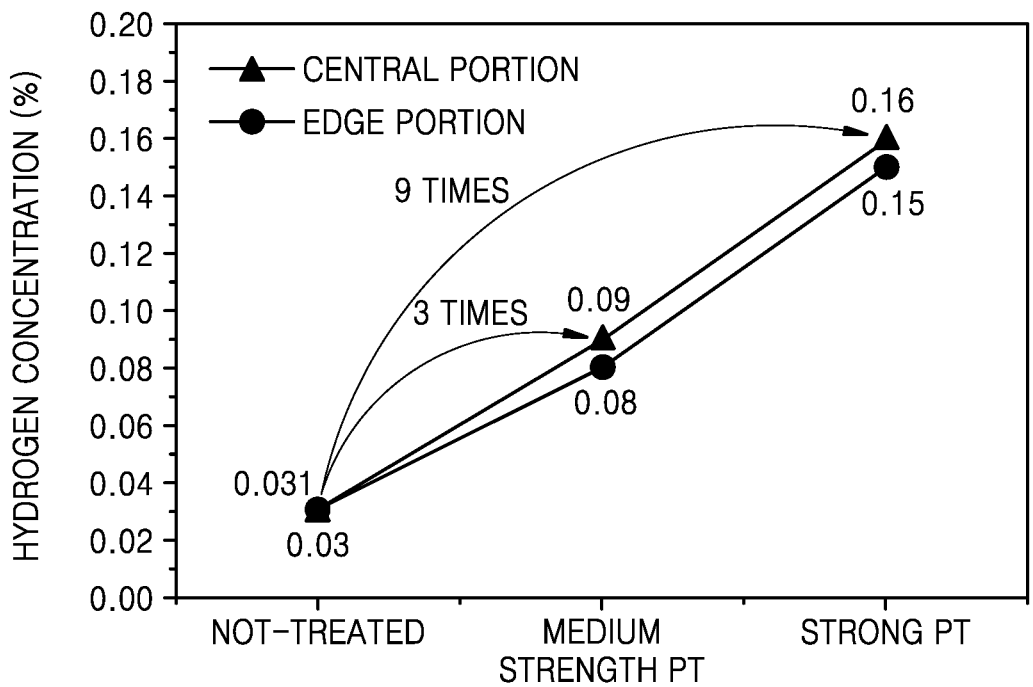
FIGS. 9 and 10 are graphs showing hydrogen concentrations of elements in a display device according to an exemplary embodiment.
Figure 10:
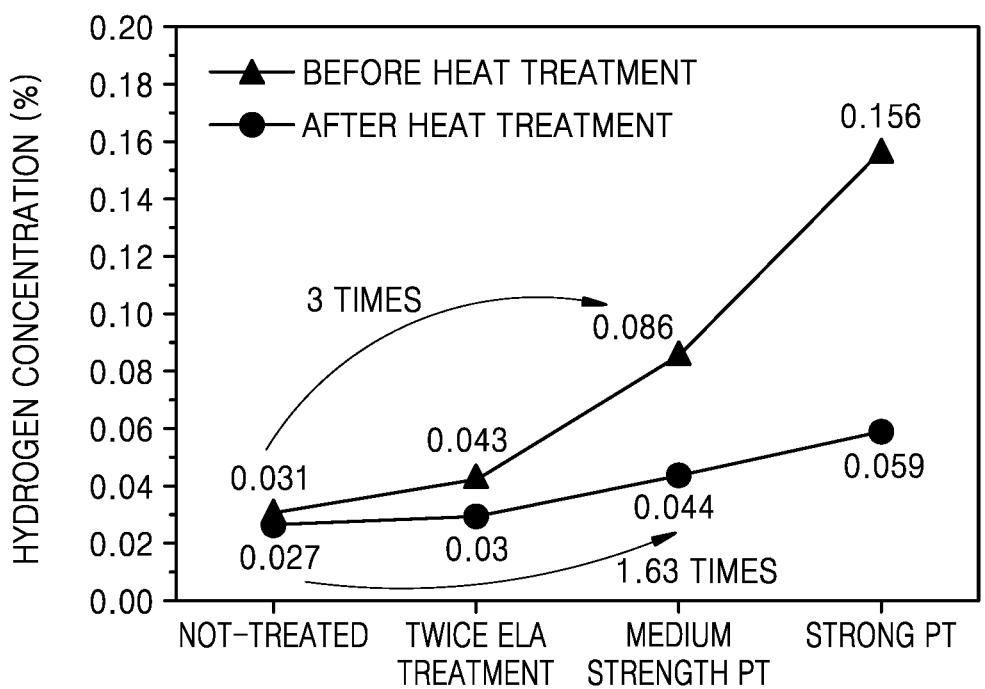

FIGS. 9 and 10 are graphs showing hydrogen concentrations of elements in the display device according to an exemplary embodiment of the inventive concept. As shown in FIG. 9, a hydrogen concentration in the case where a hydrogen-plasma treatment of medium strength is performed (Medium Strength PT) is three times a hydrogen concentration in the case where a hydrogen-plasma treatment is not performed (Not-Treated). A hydrogen concentration in the case where a strong hydrogen-plasma treatment is performed (Strong PT) is five times a hydrogen concentration in the case where a hydrogen-plasma treatment is not performed (Not-Treated). FIG. 10 shows the case where a hydrogen-plasma treatment is performed and then heat treatment is performed at about 400° C. for about 30 minutes. It is shown that, when a hydrogen-plasma treatment of medium strength is performed (Medium Strength PT) after excimer-laser annealing is performed two times (Twice ELA Treatment), a hydrogen concentration increases to about 1.63 times compared to the case where the hydrogen-plasma treatment is not performed.

Figure 11:
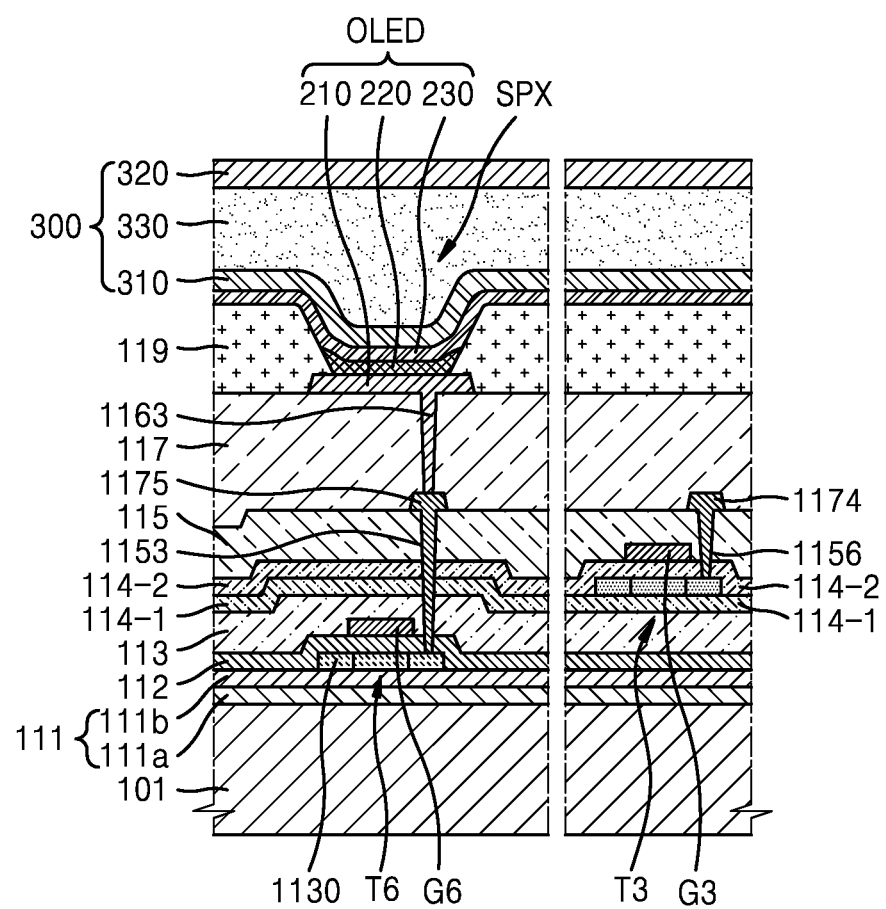
FIG. 11 is a cross-sectional view of a portion of a display device according to another exemplary embodiment of the inventive concept.

FIG. 11 is a cross-sectional view of a portion of a display device according to another exemplary embodiment of the inventive concept. As shown in FIG. 11, in the display device according to the present embodiment, a layer on which the compensation semiconductor layer (e.g., the third semiconductor layer) is located is different from a layer on which the emission control semiconductor layer of the emission control thin film transistor T6 is located. The layer on which the emission control semiconductor layer of the emission control thin film transistor T6 is located is the same as a layer on which the driving thin film transistor T1 is located. Therefore, the layer on which the compensation semiconductor layer (e.g., the third semiconductor layer) is located is different from the layer on which the driving thin film transistor T1 is located.

As described above, it is required that a leakage current amount of the compensation thin film transistor T3 in an off-state is less than a leakage current amount of the driving thin film transistor T1 in an off-state. To accomplish this, the hydrogen-plasma treatment, etc. are performed on the semiconductor layer of the compensation thin film transistor T3. During the hydrogen-plasma treatment, the hydrogen-plasma treatment should not influence the semiconductor layer of the driving thin film transistor T1. The hydrogen-plasma treatment, etc. may be selectively performed on only the compensation semiconductor layer by making the layer on which the compensation semiconductor layer (e.g., the third semiconductor layer) is located different from the layer on which the driving semiconductor layer of the driving thin film transistor T1 is located.

As shown in FIG. 11, like the emission control semiconductor layer of the emission control thin film transistor T6, the driving semiconductor layer of the driving thin film transistor T1 is located on the buffer layer 111 which may be a first layer. In the display device according to the present embodiment, a third gate insulating layer 114-1 and a fourth gate insulating layer 114-2 are sequentially stacked on the second gate insulating layer 113. The third gate insulating layer 114-1 may directly contact the second gate insulating layer 113. The third gate insulating layer 114-1 and the fourth gate insulating layer 114-2 each may include an inorganic material such as silicon oxide ($SiO_2$), silicon nitride ($SiN_x$) silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The compensation semiconductor layer is located between the third gate insulating layer 114-1 and the fourth gate insulating layer 114-2. In other words, the compensation semiconductor layer is located on the third gate insulating layer 114-1 which may be a second layer. The third gate insulating layer 114-1 is located over the buffer layer 111. The compensation gate electrode G3 is located on the fourth gate insulating layer 114-2. The interlayer insulating layer 115 is located on the fourth gate insulating layer 114-2 to cover the compensation gate electrode.

In the display device according to the present embodiment, when forming the compensation semiconductor layer of the compensation thin film transistor T3 and then performing the hydrogen-plasma treatment, etc. on at least a portion thereof, the influence of the hydrogen-plasma treatment on the emission control thin film transistor T6 or the driving thin film transistor T1 may be minimized. In addition, it is easy to selectively perform the excimer-laser annealing on the compensation semiconductor layer of the compensation thin film transistor T3 a plurality of times. It is also possible to both selectively perform the excimer-laser annealing a plurality of times and apply the hydrogen-plasma treatment on the compensation semiconductor layer of the compensation thin film transistor T3.

Figure 12:
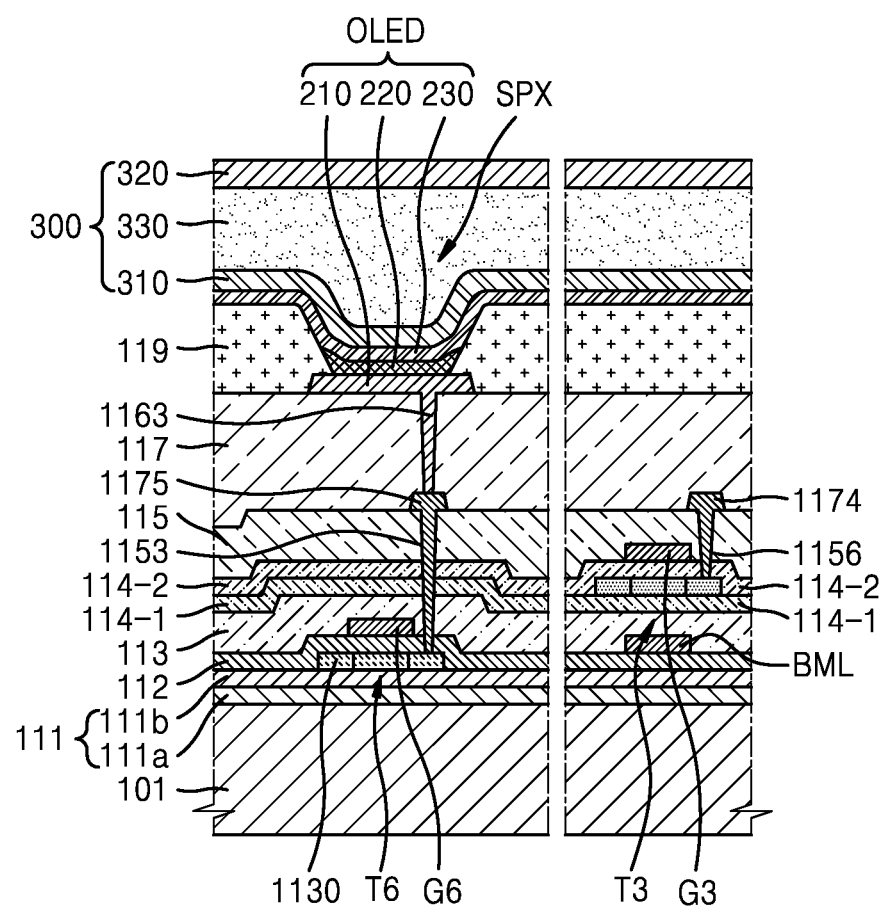
FIG. 12 is a cross-sectional view of a portion of a display device according to another exemplary embodiment of the inventive concept.

Furthermore, as shown in FIG. 12, which is a cross-sectional view of a portion of a display device according to another exemplary embodiment of the inventive concept, the display device may further include a bottom metal layer BML located below the third gate insulating layer 114-1, the bottom metal layer BML corresponding to the third gate electrode. The bottom metal layer BML may be electrically connected to the compensation gate electrode G3 of the compensation thin film transistor T3 such that an electric potential of the bottom metal layer BML is equal to an electric potential of the compensation gate electrode G3. Since a gate voltage is applied from above and below the compensation semiconductor layer, the leakage current of the compensation thin film transistor T3 may be reduced even more.

According to an exemplary embodiment of the inventive concept having the above described configurations, the display device in which flickering is prevented or minimized while displaying an image at a low frequency can be implemented.

While the inventive concept has been described with reference to one or more exemplary embodiments thereof, it will be understood by those of ordinary skill in the art that various changes in form and details may be made thereto without departing from the spirit and scope of the inventive concept as set forth by the following claims.

What is claimed is:

1. A display device, comprising:
a first thin film transistor including a first semiconductor layer and a first gate electrode, the first semiconductor layer including a first channel region, a first source region, and a first drain region;
a third thin film transistor including a third semiconductor layer and a third gate electrode, the third semiconductor layer including a third channel region, a third source region, and a third drain region, one of the third source region and the third drain region being electrically connected to the first gate electrode, and the other of the third source region and the third drain region being electrically connected to one of the first source region and the first drain region, wherein a leakage current of the third thin film transistor in an off-state is less than a leakage current of the first thin film transistor in an off-state;
a data line configured to transfer a data signal;
a second thin film transistor including a second semiconductor layer and a second gate electrode, the second thin film transistor being turned on in response to a scan signal transferred to the second gate electrode and performing a switching operation for transferring the data signal from the data line to the first thin film transistor; and
a pixel electrode electrically connected to one of the first source region and the first drain region, the one of the first source region and the first drain region being electrically connected to the third thin film transistor.

2. The display device of claim 1, wherein a grain boundary trap density of a portion of the third semiconductor layer is less than a grain boundary trap density of the first semiconductor layer.

3. The display device of claim 2, wherein the grain boundary trap density of the portion of the third semiconductor layer is about 0.2 times to about 0.5 times the grain boundary trap density of the first semiconductor layer.

4. The display device of claim 2, wherein a grain boundary trap density of a portion of the third channel region near the third drain region is less than the grain boundary trap density of the first semiconductor layer.

5. The display device of claim 2, wherein a grain boundary trap density of the third drain region is less than the grain boundary trap density of the first semiconductor layer.

6. The display device of claim 1, wherein a hydrogen concentration of a portion of the third semiconductor layer is greater than a hydrogen concentration of the first semiconductor layer.

7. The display device of claim 6, wherein the hydrogen concentration of the portion of the third semiconductor layer is about 1.5 times to about 5 times the hydrogen concentration of the first semiconductor layer.

8. The display device of claim 6, wherein a hydrogen concentration of a portion of the third channel region near the third drain region is less than the hydrogen concentration of the first semiconductor layer.

9. The display device of claim 6, wherein a hydrogen concentration of the third drain region is less than the hydrogen concentration of the first semiconductor layer.

10. The display device of claim 1, wherein a portion of the third semiconductor layer is hydrogen-plasma treated.

11. The display device of claim 10, wherein a portion of the third channel region near the third drain region is hydrogen-plasma treated.

12. The display device of claim 10, wherein the third drain region is hydrogen-plasma treated.

13. The display device of claim 1, wherein a portion of the third semiconductor layer is crystallized by performing excimer laser-annealing a plurality of times.

14. The display device of claim 13, wherein a portion of the third channel region near the third drain region is crystallized by performing excimer laser-annealing a plurality of times.

15. The display device of claim 13, wherein the third drain region is crystallized by performing excimer laser-annealing a plurality of times.

16. The display device of claim 1, wherein the first semiconductor layer is located on a first layer, and the third semiconductor layer is located on a third layer.

17. The display device of claim 16, wherein the third layer overlaps the first layer.

18. The display device of claim 16, wherein the third gate electrode is located above the third semiconductor layer.

19. The display device of claim 18, further comprising a bottom metal layer located below the third layer to correspond to the third gate electrode.

20. The display device of claim 19, wherein the bottom metal layer is electrically connected to the third gate electrode.

21. The display device of claim 19, wherein an electric potential of the bottom metal layer is equal to an electric potential of the third gate electrode.

22. A display device, comprising:
a driving thin film transistor including a driving gate electrode, a driving source region, and a driving drain region;
a compensation thin film transistor including a compensation gate electrode, a compensation source region, and a compensation drain region, the compensation drain region being electrically connected to the driving gate electrode, and the compensation source region being electrically connected to the driving drain region, wherein a leakage current of the compensation thin film transistor in an off-state is less than a leakage current of the driving thin film transistor in an off-state;
a data line configured to transfer a data signal;
a switching thin film transistor including a switching gate electrode, a switching source region, and a switching drain region, the switching thin film transistor being turned on in response a scan signal transferred to the switching gate electrode and transferring the data signal from the data line to the driving thin film transistor; and
a pixel electrode electrically connected to the driving drain region and the compensation source region.

23. The display device of claim 22, wherein a grain boundary trap density of a portion of a compensation semiconductor layer of the compensation thin film transistor is less than a grain boundary trap density of a driving semiconductor layer of the driving thin film transistor.

24. The display device of claim 22, wherein a hydrogen concentration of a portion of a compensation semiconductor layer of the compensation thin film transistor is greater than a hydrogen concentration of a driving semiconductor layer of the driving thin film transistor.

25. A display device, comprising:
a first thin film transistor including a first terminal, a second terminal, and a third terminal;
a second thin film transistor including a fourth terminal, a fifth terminal, and a sixth terminal, the fifth terminal being directly connected to the first terminal, and the sixth terminal being directly connected to the second terminal, wherein a leakage current of the second thin film transistor in an off-state is less than a leakage current of the first thin film transistor in an off-state;

a line configured to transfer a data signal;

a third thin film transistor including a seventh terminal a eighth terminal, and a ninth terminal, the third thin film transistor being turned on in response to a scan signal and performing a switching operation for transferring the data signal from the line to the first thin film transistor; and a pixel electrically connected to the second terminal and the sixth terminal.

\* \* \* \* \*